US009484335B2

(12) United States Patent
Cho et al.

(10) Patent No.: US 9,484,335 B2
(45) Date of Patent: Nov. 1, 2016

(54) SEMICONDUCTOR DEVICE WITH BURIED BITLINE AND METHOD FOR FABRICATING THE SAME

(71) Applicant: SK hynix Inc., Gyeonggi-do (KR)

(72) Inventors: Heung-Jae Cho, Gyeonggi-do (KR); Eui-Seong Hwang, Gyeonggi-do (KR); Eun-Shil Park, Gyeonggi-do (KR); Tae-Yoon Kim, Gyeonggi-do (KR); Ju-Hyun Myung, Gyeonggi-do (KR); Kyu-Hyung Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 353 days.

(21) Appl. No.: 13/718,683

(22) Filed: Dec. 18, 2012

(65) Prior Publication Data

US 2014/0061850 A1    Mar. 6, 2014

(30) Foreign Application Priority Data

Aug. 28, 2012 (KR) .................. 10-2012-0094396

(51) Int. Cl.
| | |
|---|---|
| *H01L 21/762* | (2006.01) |
| *H01L 27/02* | (2006.01) |
| *H01L 27/108* | (2006.01) |
| *H01L 21/764* | (2006.01) |

(52) U.S. Cl.
CPC ......... *H01L 27/0203* (2013.01); *H01L 21/764* (2013.01); *H01L 21/76229* (2013.01); *H01L 27/10876* (2013.01); *H01L 27/10885* (2013.01)

(58) Field of Classification Search
CPC ............... H01L 21/76229; H01L 27/0203; H01L 27/10876; H01L 27/10885; H01L 21/764
See application file for complete search history.

(56) References Cited

U.S. PATENT DOCUMENTS

| 7,736,969 B2 | 6/2010 | Abbott et al. | |
|---|---|---|---|
| 2010/0308466 A1 | 12/2010 | Takesako | |
| 2011/0156118 A1* | 6/2011 | Park ............................... | 257/306 |
| 2011/0303974 A1* | 12/2011 | Kim et al. ................... | 257/329 |
| 2012/0146221 A1* | 6/2012 | Shim ............................ | 257/741 |

FOREIGN PATENT DOCUMENTS

KR        1020120006713        1/2012

* cited by examiner

*Primary Examiner* — A. Sefer
*Assistant Examiner* — Benjamin Tzu-Hung Liu
(74) *Attorney, Agent, or Firm* — IP & T Group LLP

(57) ABSTRACT

A method for fabricating a semiconductor device includes forming active regions which are separated by a plurality of first trenches, forming supports which fill the first trenches; etching the active regions and defining second trenches which are shallower than the first trenches, forming spacers on sidewalls of the second trenches, etching bottoms of the second trenches and defining third trenches, forming punch-through preventing patterns which fill lower portions of the third trenches, etching sidewalls which are not protected by the punch-through preventing patterns and the spacers, and forming recessed sidewalls which face each other, and forming buried bit lines in the recessed sidewalls.

9 Claims, 16 Drawing Sheets

SEMICONDUCTOR DEVICE WITH BURIED BITLINE AND METHOD FOR FABRICATING THE SAME

CROSS-REFERENCE TO RELATED APPLICATIONS

The present application claims priority of Korean Patent Application No. 10-2012-0094396, filed on Aug. 28, 2012, which is incorporated herein by reference in its entirety.

BACKGROUND

1. Field

Exemplary embodiments of the present invention relate to a semiconductor device, and more particularly, to a semiconductor device with buried bit lines and a method for fabricating the same.

2. Description of the Related Art

Most semiconductor devices include transistors. For example, in a memory device such as a DRAM, a memory cell includes a cell transistor such as a MOSFET. In general, in a MOSFET, source/drain regions are formed in a semiconductor substrate, and thus, a planar channel is formed between the source region and the drain region. Such a general MOSFET is referred to as a planar channel transistor.

As improvements in the degree of integration and the performance of a memory device are continuously demanded, a technology for fabricating a MOSFET faces physical limitations. For example, as the size of a memory cell shrinks, the size of a MOSFET shrinks, as a result of which the channel length of the MOSFET cannot help but be shortened. If the channel length of a MOSFET is shortened, data retaining properties are likely to deteriorate, whereby the characteristics of the memory device may be degraded.

In consideration of these problems, a vertical channel transistor (VCT) has been suggested in the art. The vertical channel transistor includes a pillar in which a vertical channel is formed. A source region and a drain region are formed in the upper and lower portions of the pillar. Any one of the source region and the drain region is connected with a bit line.

FIG. 1 is a view illustrating a conventional semiconductor device.

Referring to FIG. 1, a plurality of body lines 12 are formed on a semiconductor substrate 11 in such a way as to be separated from one another. Pillars 13 are vertically formed on the surfaces of the body lines 12. Buried bit lines 14 are buried in the body lines 12. The pillars 13 include first and second source/drain regions 16 and 18 and channel regions 17. Word lines 15 are formed on the sidewalls of the pillars 13 to extend in a direction crossing with the buried bit lines 14. Since the word lines 15 have vertical structures, vertical channels are formed.

In the conventional art shown in FIG. 1, the body lines 12 are formed by etching the semiconductor substrate 11 in consideration of the height of the pillars 13 including the channel regions 17. Thereafter, by etching the upper parts of the body lines 12, the pillars 13 are formed.

In the conventional art, in order to prevent punch-through P from occurring between adjacent buried bit lines 14, a predetermined height P1 should be secured under the buried bit lines 14. The height P1 for preventing the punch-through P should be approximately 80 to 90 nm including the depth of the first source/drain regions 16 lying under the buried bit lines 14. Therefore, because a total height H including the body lines 12 and the pillars 13 increases, high aspect ratio etching is required when forming the body lines 12.

As a result, in the conventional art, not only the high aspect ratio etching is required since the height of the pillars 13 should be considered when forming the body lines 12, but also aspect ratio further increases in order to prevent the punch-through P between the buried bit lines 14. As a consequence, pattern leaning may result.

SUMMARY

In an exemplary embodiment, a method for fabricating a semiconductor device may include: forming active regions in a semiconductor substrate, the active regions being separated by a plurality of first trenches; forming a support in each first trench of the plurality of first trenches; defining, by etching the active regions, second trenches that are shallower than the plurality of first trenches; and forming a pair of buried bit lines in each of the second trenches.

In an exemplary embodiment, a method for fabricating a semiconductor device may include: forming, on a semiconductor substrate, active regions that are separated by a plurality of first trenches; forming a support in each first trench of the plurality of first trenches; etching the active regions to define second trenches that are shallower than the plurality of first trenches; forming spacers on sidewalls of the second trenches; etching bottoms of the second trenches to define third trenches; forming punch-through preventing patterns in the third trenches; etching portions of the sidewalls that are not covered by the punch-through preventing patterns or the spacers to form facing recessed sidewalls; and forming buried bit lines in the facing recessed sidewalls.

In an exemplary embodiment, a semiconductor device may include: a plurality of active regions formed on a semiconductor substrate and separated, where the plurality of active regions are separated by first trenches; a support formed in each of the first trenches; second trenches dividing the plurality of active regions, where the second trenches have a depth that is shallower than a depth of the first trenches; and a pair of buried bit lines formed in each of the second trenches.

In an exemplary embodiment, a semiconductor device may include: a pair of body lines having recessed sidewalls that face each other; a trench extending beneath the recessed sidewalls; a punch-through preventing pattern formed in the trench; and buried bit lines formed in the recessed sidewalls.

In an exemplary embodiment, a semiconductor device may include: a plurality of active regions formed on a semiconductor substrate, where the plurality of active regions are separated by first trenches; a support formed in each first trench; second trenches dividing the plurality of active regions; a spacer formed on each sidewall of each of the second trenches; a pair of recessed sidewalls extending under each second trench; a third trench extending under the pair of recessed sidewalls; a punch-through preventing pattern formed in the third trench; and buried bit lines formed on the sidewalls.

DETAILED DESCRIPTION

Figure 1:
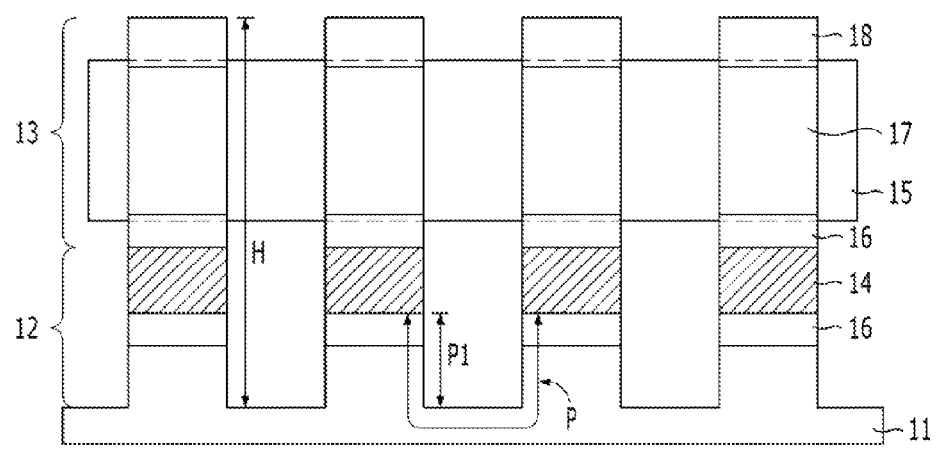
FIG. 1 is a view illustrating a conventional semiconductor device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
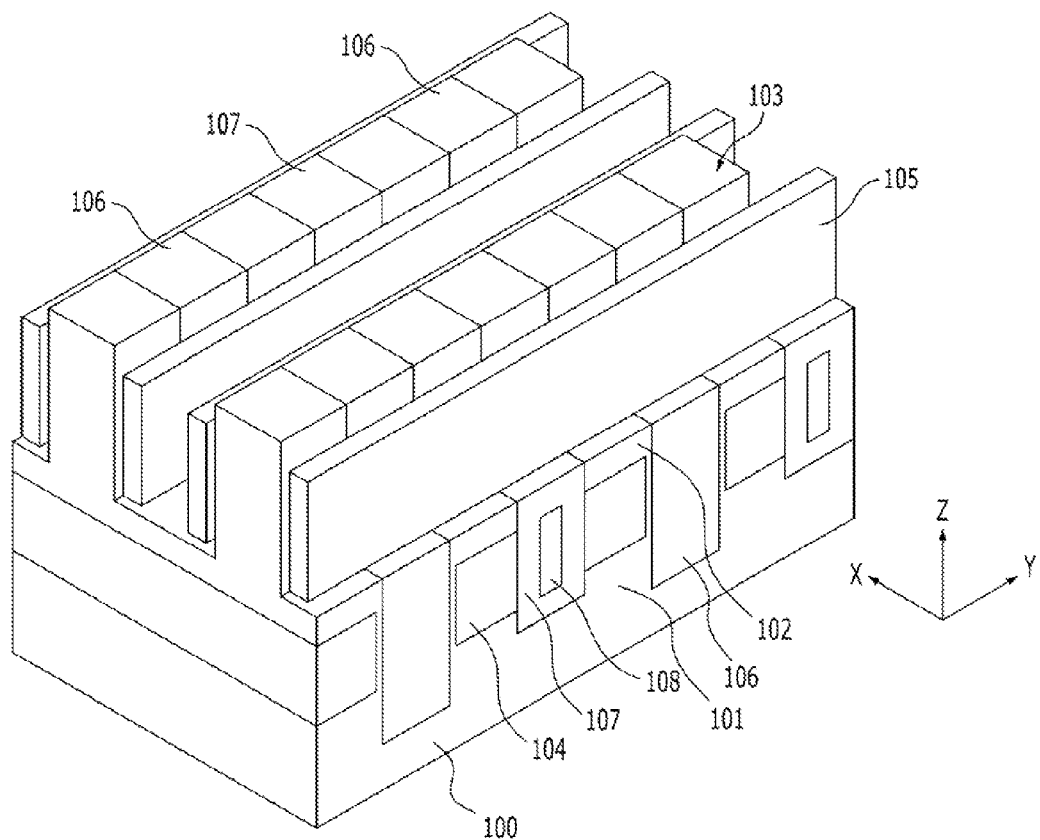
FIG. 2A is a view illustrating a semiconductor device with buried bit lines in accordance with an exemplary embodiment.

FIG. 2A is a view illustrating a semiconductor device with buried bit lines in accordance with an exemplary embodiment. FIG. 28 is a view illustrating a semiconductor device with buried bit lines in accordance with an exemplary embodiment.

Figure 2B:
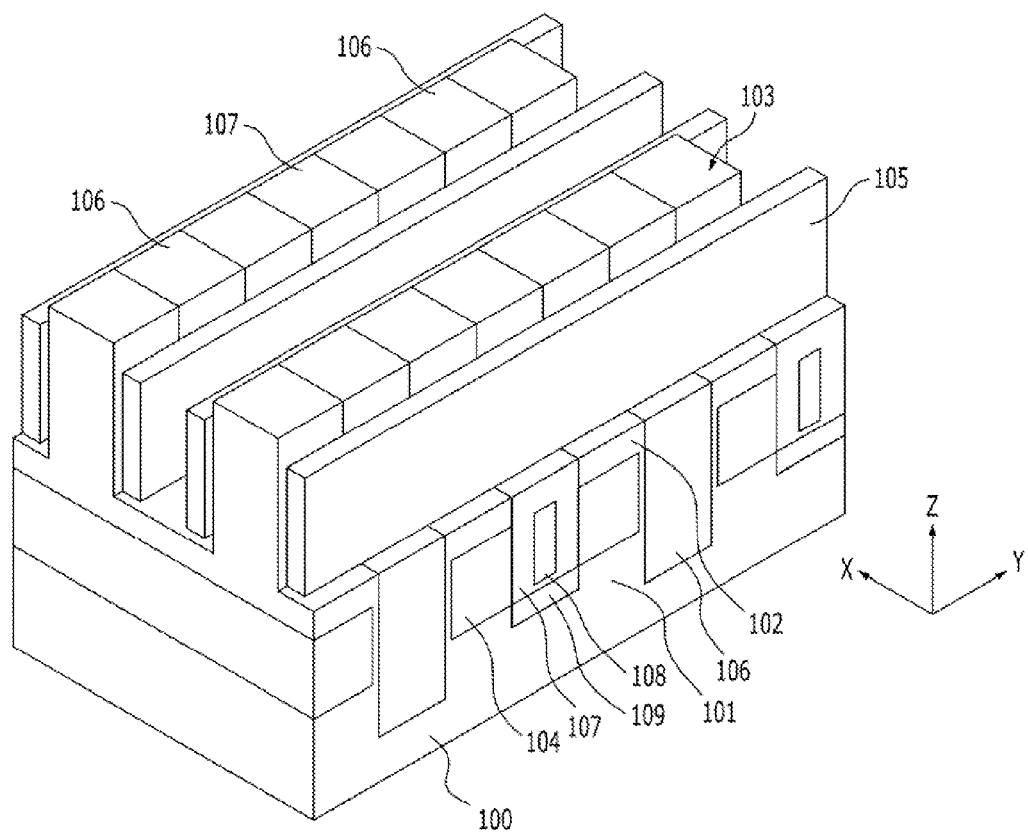
FIG. 2B is a view illustrating a semiconductor device with buried bit lines in accordance with an exemplary embodiment.

Referring to FIGS. 2A and 2B, a semiconductor device includes buried bit lines 104, pillars 103, and word lines 105. A plurality of active regions with vertical structures including semiconductor bodies 101, body lines 102 and the pillars 103 are formed on a semiconductor substrate 100. Supports 106 are formed between the plurality of active regions. The buried bit lines 104 are buried in the body lines 102. The buried bit lines 104 extend in a first direction X, and the word lines 105 extend in a second direction Y. The active regions may extend in a third direction Z that is perpendicular to the first direction X and the second direction Y.

The semiconductor substrate 100 may include a silicon-containing substance, such as monocrystalline silicon. The semiconductor bodies 101, the body lines 102, the pillars 103, and the semiconductor substrate 100 may include the same substance. Accordingly, the semiconductor bodies 101, the body lines 102, and the pillars 103 include monocrystalline silicon.

Each active region includes a semiconductor body 101, a pair of body lines 102, which are formed on the semiconductor body 101, and a plurality of pillars 103 that are formed on the body lines 102. A plurality of pillars 103 may be formed on each body line 102. The semiconductor body 101 is formed perpendicular to the first direction X and the second direction Y on the semiconductor substrate 100. The body lines 102 are formed perpendicular to the first direction X and the second direction Y on the semiconductor body 101. The pillars 103 may be formed to extend perpendicular to the first direction X and the second direction Y from the body lines 102. For example, the body lines 102 and the pillars 103 may be orthogonal to each other. The plurality of pillars 103 are formed to be separated from one another on the body lines 102. The plurality of pillars 103 may have the array layout of a matrix structure. The plurality of pillars 103 may include the channel regions of vertical channel transistors. Furthermore, the plurality of pillars 103 may have structures in which the source/drain regions and the channel regions of vertical channel transistors are formed.

The body lines 102 are formed perpendicular to the first direction X and the second direction Y on the semiconductor body 101. A pair of body lines 102 may be formed on the semiconductor body 101. The pair of body lines 102 may extend in the first direction X. The buried bit lines 104 and the pair body lines 102 may extend in the first direction X in the same manner. Although descriptions will be made later, the pair body lines 102 may be formed by dividing a line-type active region. A support 106 is formed between the pair of body lines 102. Body lines 102 may be formed into a pair on each semiconductor body 101. The supports 106 may be formed in trenches separating adjacent pairs of body lines 102. The supports 106 may include a dielectric layer. The depth of the trenches is deeper than the buried bit lines 104. Thus, it is possible to prevent the punch-through between the buried bit lines 104, which are formed with the supports 106 therebetween. The supports 106 may extend to be formed between the pillars 103.

The buried bit lines 104 are buried in the body lines 102. Each body line 102 may have a recessed sidewall that is formed with the buried bit line 104. The pair of body lines 102 that are formed on the semiconductor body 101 may face each other, and due to this fact, the recessed sidewalls may face each other. The buried bit lines 104 may extend in the first direction X. The buried bit lines 104 include a metallic substance, such as a metal or a metal silicide. As a consequence, the buried bit lines 104 have low resistance.

Interlayer dielectric layers 107 may be formed between the buried bit lines 104. The buried bit lines 104 may have air gaps 108. As shown in FIG. 2A, the trenches, in which the interlayer dielectric layers 107 are formed, may be deeper than the buried bit lines 104. Therefore, it is possible to prevent the punch-through between the buried bit lines 104, which are formed with the interlayer dielectric layers 107 interposed therebetween. As shown in FIG. 2B, punch-through preventing patterns 109 may be formed under the interlayer dielectric layers 107. The punch-through preventing patterns 109 may include a dielectric layer. The interlayer dielectric layer 107s may extend to be formed between the pillars 103. When viewed in the second direction Y, the supports 106, the pillars 103 and the Interlayer dielectric layer 107s may be alternately formed.

The word lines 105 are formed on the sidewalls of the pillars 103. The word lines 105 are vertically formed on the sidewalls of the pillars 103, and thus, are referred to as vertical word lines. The word lines 105 may be formed on both sidewalls of the pillars 103 and thus, may form double word line structures. Even though the double word line structures are formed, ends of the respective word lines 105 may be connected. Since the pillars 103 serve as regions where the channels of vertical channel transistors are formed, vertical channels are formed by the word lines 105. By this fact, vertical channel transistors, including the word lines 105, source regions, channel regions and drain regions are formed. The word lines 105 may extend in the second direction Y that is perpendicular to the first direction X (the extending direction of the buried bit lines 104). The word lines 105 include a metallic substance, such as, for example, titanium nitride (TiN) or a stack of a tungsten nitride and tungsten (WN/W). The word lines 105 and the buried bit lines 104 may be separated from each other by a dielectric layer (not shown) may be additionally formed between the word lines 105 and the buried bit lines 104. Here, the dielectric layer may include, for example, a silicon oxide. In an exemplary embodiment, the word lines 105 may extend in the second direction Y that is perpendicular to the first direction X (the extending direction of the buried bit lines 104) while surrounding the sidewalls of the pillars 103. Moreover, after forming gate electrodes to surround the sidewalls of the pillars 103, the word lines 105 may be formed to be connected with the gate electrodes.

According to FIGS. 2A and 2B, vertical structures where the buried bit lines 104 are positioned are formed below the pillars 103. As a consequence, since it is not necessary to form the buried bit lines 104 between the pillars 103, high integration becomes possible.

The buried bit lines 104 are buried in the body lines 102. Accordingly, adjacent buried bit lines 104 are sufficiently separated from one another, so that a parasitic capacitance ($C_B$) between adjacent buried bit lines 104 may be decreased. Furthermore, because the interlayer dielectric layers 107, having the air gaps 108, are formed between adjacent buried bit lines 104, the parasitic capacitance may further be decreased.

Since the supports 106 are formed between the adjacent pairs of body lines 102, it is possible to prevent the body lines 102 and the pillars 103 from leaning.

Also, since the trenches in which the supports 106 are formed and the trenches in which the interlayer dielectric layers 107 are formed are deeper than the buried bit lines 104, the punch-through between adjacent buried bit lines 104 may be prevented. Furthermore, since the punch-through preventing patterns 109 are formed under the interlayer dielectric layers 107, the punch-through between adjacent buried bit lines 104 may be further prevented.

FIGS. 3A to 3I are views illustrating an exemplary method for forming the buried bit lines of the semiconductor device in accordance with an exemplary embodiment.

Figure 3A:
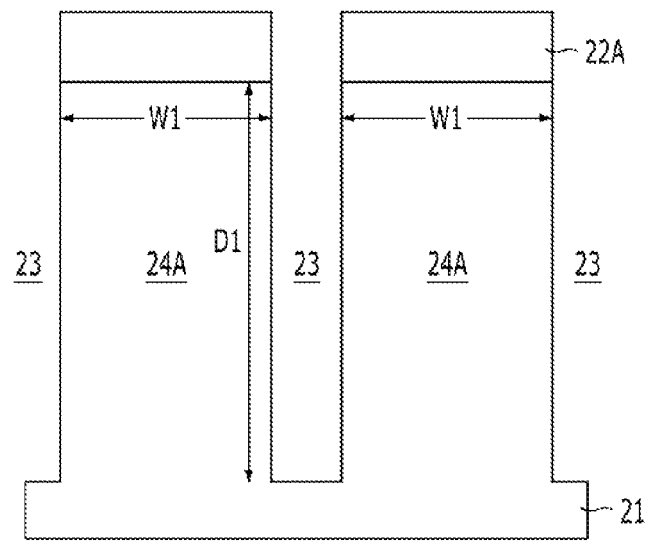
FIGS. 3A to 3I are views illustrating an exemplary method for forming the buried bit lines of the semiconductor device in accordance with an exemplary embodiment.

Referring to FIG. 3A, first mask patterns 22A are formed on a semiconductor substrate 21. The semiconductor substrate 21 may include a monocrystalline substance, such as monocrystalline silicon. The first mask patterns 22A include a silicon nitride. The first mask patterns 22A may be a stack structure that includes a silicon oxide and a silicon nitride. For example, the first mask patterns 22A may be deposited in order of a silicon nitride and a silicon oxide. Furthermore, the first mask patterns 22A may be deposited in order of a silicon nitride, a silicon oxide, a silicon oxynitride, or an amorphous carbon. In the case where the silicon nitride is included, a pad oxide layer (not shown) may be additionally formed between the semiconductor substrate 21 and the first mask patterns 22A. The first mask patterns 22A may be formed using unillustrated photoresist patterns. The first mask patterns 22A are formed to extend in the first direction. The first mask patterns 22A may include line patterns that extend in the first direction X.

Next, the semiconductor substrate 21 is etched using the first mask patterns 22A as etch masks to define a plurality of first trenches 23 having a predetermined depth when measured from the upper surface of the semiconductor substrate 21. The first trenches 23 may extend in the first direction X. The first trenches 23 divide the semiconductor substrate 21 into a plurality of active regions 24A. Each active region 24A, of the plurality of active regions 24A, has a pair of sidewalls. An etching process for defining the first trenches 23 may include anisotropic etching. When viewed on the top, the active regions 24A are separated by the first trenches 23 and have line-type shapes that extend in the first direction X. Also, the active regions 24A are formed perpendicular to the first direction X and the second direction Y on the semiconductor substrate 21.

As described above, the plurality of active regions 24A are separated from one another by the first trenches 23. The plurality of active regions 24A each have a first width W1. Since the first width W1 has a substantially large dimension based on two body lines and a space defined therebetween, it is possible to prevent the active regions 24A from leaning when defining the first trenches 23. The first trenches 23 have a first depth D1.

Figure 3B:
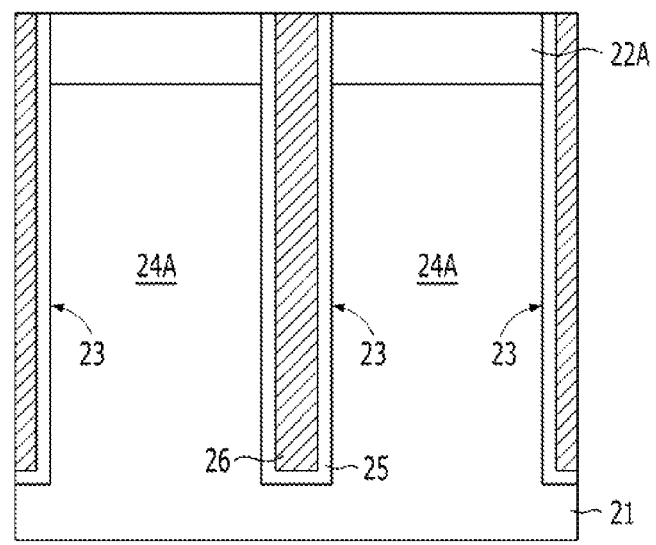

Referring to FIG. 3B, a liner layer 25 may be formed on the sidewalls of the active regions 24A that define the sidewalls of a first trench 23 to fill the first trench 23. The liner layer 25 may include a nitride, such as a silicon nitride. A support 26 is then formed in the first trench 23, on the liner layer 25, to fill the first trench. The support 26 may include an oxide, such as a silicon oxide. The support 26 may include a substance with a low dielectric constant, so that a parasitic capacitance between buried bit lines (that will be subsequently formed) may be decreased. In order to form the support 26, a planarization process, such as etch-back or CMP (chemical mechanical polishing), may be performed after the first trench is formed 23.

The support 26 has is formed between adjacent active regions 24A of the plurality of active regions 24A. Thus, pattern leaning may be prevented when subsequently performing an etching process on the adjacent active regions 24A. Also, the support 26 may serve as a separation layer that separates adjacent active regions 24A from each other.

Figure 3C:
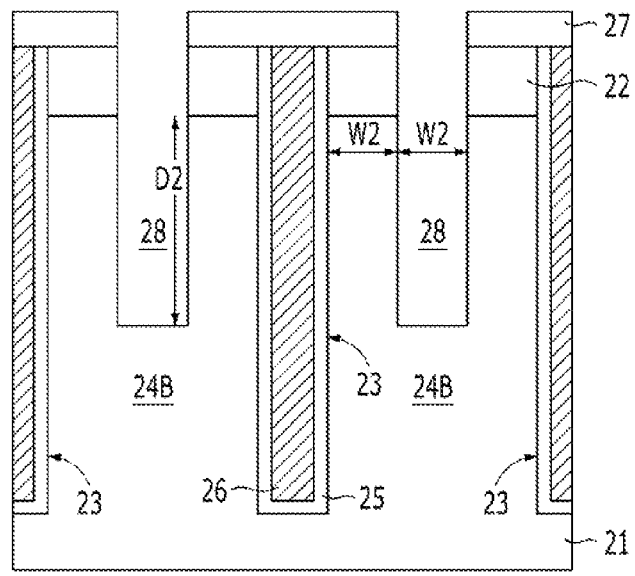

Referring to FIG. 3C, second mask patterns 27 are formed on the supports 26 and the first mask patterns 22A. The second mask patterns 27 may include line patterns that extend in the first direction X. Portions of the first mask patterns 22A are exposed through line-type spaces that are defined between adjacent second mask patterns 27. Middle portions of the respective first mask patterns 22A may be exposed through the spaces between the second mask patterns 27.

In this way, the second mask patterns 27 cover at least the upper ends of the supports 26 and have the line-type spaces that are patterned to expose the middle portions of the first mask patterns 22A.

The second mask patterns 27 may be formed of a substance that may provide an etching selectivity with respect to the first mask patterns 22A, such as amorphous carbon. A photolithography process may be employed to form the second mask patterns 27.

The exposed first mask patterns 22A and active regions 24A that lie under the first mask patterns 22A are etched using the second mask patterns 27 as etch masks to define a plurality of preliminary second trenches 28. The respective preliminary second trenches 28 are defined between adjacent first trenches 23. An upper portion of an active region 24A is divided by a preliminary second trench 28. An active region divided by the preliminary second trench 28 is designated by the reference numeral 24B. A first mask pattern 22 may remain on the active region 24B. The preliminary second trench 28 has a second width W2. The second width W2 may correspond to ⅓ of the first width W1. The preliminary second trench 28 has a second depth D2 that may be smaller than the first depth D1 of the first trench 23.

Since the active region 24B is supported by the support 26, pattern leaning does not occur when defining the preliminary second trench 28.

Figure 3D:
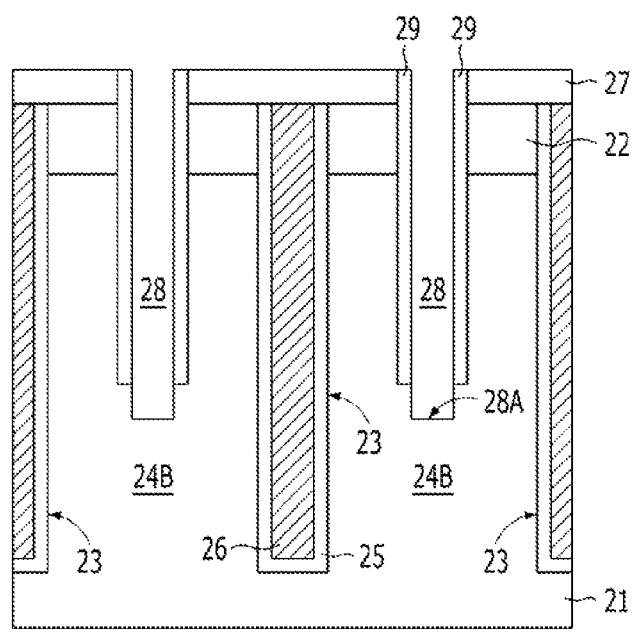

Referring to FIG. 3D, spacers 29 are formed on sidewalls of the active region 24B that defines the sidewalls of the preliminary second trench 28. The spacers 29 may include a nitride, such as a silicon nitride. In order to form the spacers 29, the nitride may be conformally formed, and then, etch-back may be performed. The spacers 29 cover the sidewalls of the preliminary second trench 28 and cover the sidewalls of the first mask pattern 22 and the second mask pattern 27. In an etch-back process for forming the spacers 29, a surface of the active region 24B that defines a bottom 28A of the preliminary second trench 28 may be recessed by a preselected depth, so that subsequent isotropic etching may be easily performed.

Figure 3E:
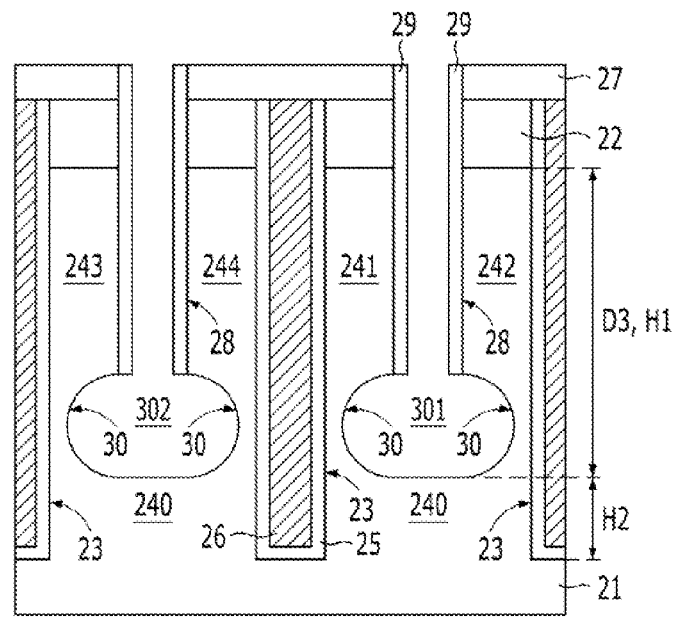

Referring to FIG. 3E, isotropic etching is performed using the spacers 29 and the first mask pattern 22 and the second mask pattern 27 as etch barriers. Therefore, the bottom of the preliminary second trench 28 is selectively etched to form recessed sidewalls 30. Therefore, a bulb-type trench structures that includes the preliminary second trench 28 and the recessed sidewalls 30 is formed. By defining a plurality of bulb-type second trenches 301 and 302, a plurality of body lines 241, 242, 243 and 244 are formed. Etch amounts on the lower sidewalls of the respective body lines 241, 242, 243 and 244 may be controlled.

Each bulb-type second trench 301 and 302 is formed between a corresponding pair of adjacent first trenches 23. Therefore, the plurality of body lines 241, 242, 243, and 244 are separated from one another by the bulb-type second trenches 301 and 302. For example, the first body line 241 and the second body line 242 are separated by the bulb-type second trench 301, and the third body line 243 and the fourth body line 244 are separated by the bulb-type second trench 302. Therefore, the first body line 241 and the second body line 242, separated by the first bulb-type trench 301, are considered to be a first body line pair. Similarly, the third body line 243 and the fourth body line 244, separated by the second bulb-type trench 302, are considered to be a second body line pair. The first body line pair and the second body line pair may be separated from each other by the support 26. In another embodiment, another body line pair may be formed with the support 26 interposed between two body lines. For instance, the first body line 241 and the fourth body line 244 may form a pair.

The first bulb-type second trench 301 and the second bulb-type second trench 302 have a third depth D3. The third depth D3 is controlled to be smaller than the first depth D1 of the first trench 23, in which the supports 26 is formed. The respective body lines 241, 242, 243 and 244 each have a height H1 that is substantially the same as the third depth D3. The respective body lines 241, 242, 243 and 244 each have the same width. Even though the third depth D3 of the first bulb-type second trench 301 and the second bulb-type second trench 302 is deep, the body lines 241, 242, 243 and 244 are prevented from leaning, due to the presence of the supports 26. When viewed on the top, the plurality of body lines 241, 242, 243 and 244 are separated from one another by the first bulb-type second trench 301 and the second bulb-type second trench 302 and extend in the first direction. The sidewalls of the body lines 241, 242, 243 and 244 are recessed by the first bulb-type second trench 301 and the second bulb-type second trench 302, respectively. The recessed sidewalls 30 are formed on the sidewalls of the respective body lines 241, 242, 243 and 244. The respective body lines 241, 242, 243 and 244 have first sidewalls and second sidewalls. The first sidewalls are formed perpendicular to the first direction X and the second direction Y, and the second sidewalls are the recessed sidewalls 30. The recessed sidewalls 30 of each of the respective body lines 241, 242, 243 and 244 face each other. The first mask patterns 22 and the second mask patterns 27 remain on the body lines 241, 242, 243 and 244. The spacers 29 remain on the sidewalls of the body lines 241, 242, 243 and 244. The recessed sidewalls 30 may be un-protected (i.e., not protected by the spacers 29.) Thus, the recessed sidewalls 30 may be referred to as un-protected recessed sidewalls 30.

According to the series of processes described above, each of the active regions 24A is divided, and the plurality of body lines 241, 242, 243 and 244, which are separated by the first bulb-type second trench 301 and the second bulb-type second trench 302, respectively, are formed. The respective body lines 241, 242, 243 and 244 have the recessed sidewalls 30. The recessed sidewalls may be formed over lower sidewalls of the respective body lines 241, 242, 243 and 244. Upper sidewalls of the body lines 241, 242, 243 and 244 are protected by the spacers 29. The heights of the upper sidewalls and the heights of the lower sidewalls of the body lines 241, 242, 243 and 244 may be controlled based on a height of the spacers 29. Semiconductor bodies 240, having a predetermined height H2, may remain under the body lines 241, 242, 243 and 244. The semiconductor bodies 240 are formed on the semiconductor substrate 21. The body lines 241, 242, 243 and 244 are formed perpendicular to the first direction X and the second direction Y on the semiconductor bodies 240. Two body lines may be formed on each semiconductor body 240. Adjacent semiconductor bodies 240 are separated from each other by the first trenches 23, and the supports 26 are formed in the first trenches 23.

Figure 3F:
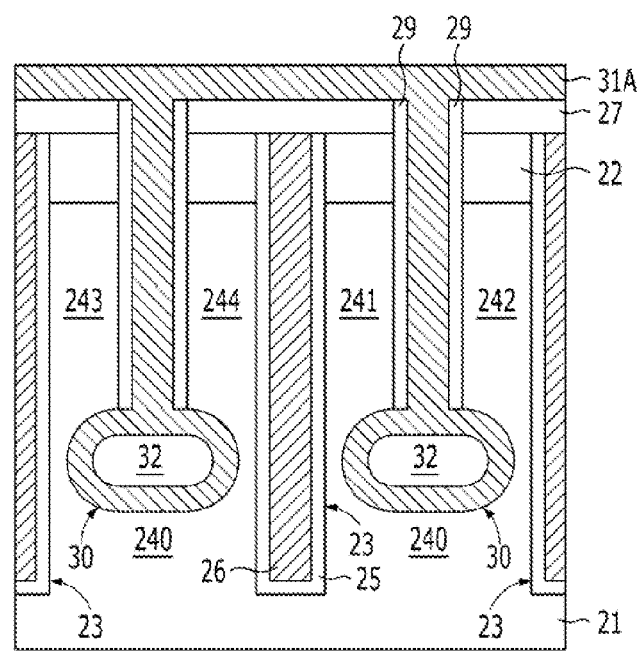

Referring to FIG. 3F, the first bulb-type second trench 301 and the second bulb-type second trench 302 are formed with a conductive layer 31A, so that voids 32 are created in the bulbs of the first bulb-type second trench 301 and the second bulb-type second trench 302.

The conductive layer 31A may include a metal, such as a near-noble metal or a refractory metal. For example, the conductive layer 31A may include cobalt (Co), titanium (Ti), tantalum (Ta), nickel (Ni), tungsten (W), platinum (Pt), or palladium (Pd). The conductive layer 31A may be formed through chemical vapor deposition (CVD) or atomic layer deposition (ALD). The deposition depth of the conductive layer 31A may be controlled to be a thickness that covers at least the un-protected recessed sidewalls 30.

Before forming the conductive layer 31A, source/drain regions (not shown) may be formed. The source/drain regions may be formed using plasma doping, tilt ion implantation, etc. For example, with the plasma doping, is possible to form the source/drain regions without experiencing a shadow effect by a surrounding structure. Thus, the source/drain regions may be formed at desired positions. The source/drain regions may be formed on the surfaces of the unprotected recessed sidewalls 30. Alternatively, in situ doped polysilicon may be used to form the source/drain regions. For example, by filling and then annealing of the doped polysilicon, the dopant in the doped polysilicon may be diffused into the body lines 241, 242, 243, and 244.

Figure 3G:
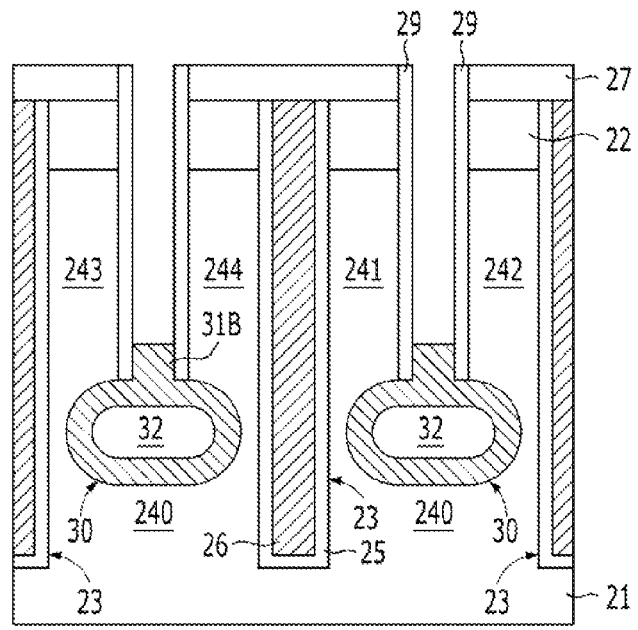

Referring to FIG. 3G, the conductive layer 31A is planarized and etched back. Thus, conductive layer patterns 31B are formed to partially fill the first bulb-type second trench 301 and the second bulb-type second trench 302.

Figure 3H:
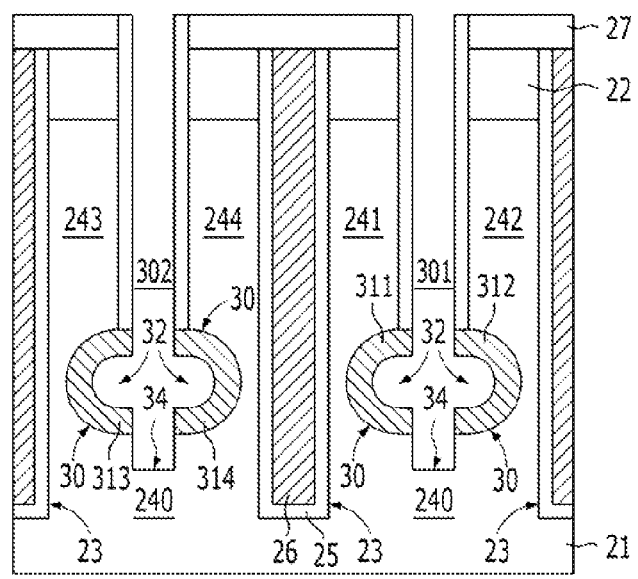

Referring to FIG. 3H, a plurality of buried bit lines 311, 312, 313 and 314 are formed by selectively etching the conductive layer patterns 31B. The conductive layer patterns 31B may be etched through etch-back, so that the bulbs of the first bulb-type second trench 301 and the second bulb-type second trench 302 define the shape of the surfaces of the buried bit lines 311, 312, 313, and 314.

The buried bit lines 311, 312, 313 and 314 may be separately formed in the first bulb-type second trench 301 and the second bulb-type second trench 302. Because the unprotected recessed sidewalls 30 of the first bulb-type second trench 301 and the second bulb-type second trench 302 have structures corresponding to the recessed sidewalls 30 of the body lines 241, 242, 243 and 244, the buried bit lines 311, 312, 313 and 314 may have structures that are formed in the recessed sidewalls 30 of the body lines 241, 242, 243 and 244. For instance, the first buried bit line 311 and the second buried bit line 312 may be separately formed in first bulb-type second trench 301, and the third buried bit line 313 and the fourth buried bit line 314 may be separately formed in second bulb-type second trench 302. The first buried bit line 311 and the fourth buried bit line 314 may be separated by the support 26. Thus, the first buried bit line 311 and the fourth buried bit line 314 may form a pair of buried bit lines. By recessing the bottoms of the first bulb-type second trench 301 and the second bulb-type second trench 302 by a predefined depth, punch-through preventing patterns 34 may be formed. By forming the punch-through preventing patterns 34, punch-through between the first buried bit line 311 and the second buried bit line 312 and punch-through between the third buried bit line 313 and the fourth buried bit line 314 may be prevented. The depth of the punch-through preventing patterns 34 is shallower than the depth of the first trenches 23. Accordingly, pattern leaning is prevented.

The plurality of buried bit lines 311, 312, 313, and 314 may form other pairs of buried bit lines with the supports 26 formed between two adjacent buried bit lines. For example, as previously discussed, the first buried bit line 311 and the fourth buried bit line 314 may form a pair of buried bit lines having the support 26 interposed therebetween. Since the depth of the first trench 23 is deep, punch-through between the first buried bit line 311 and the fourth buried bit line 314 is prevented.

Figure 3I:
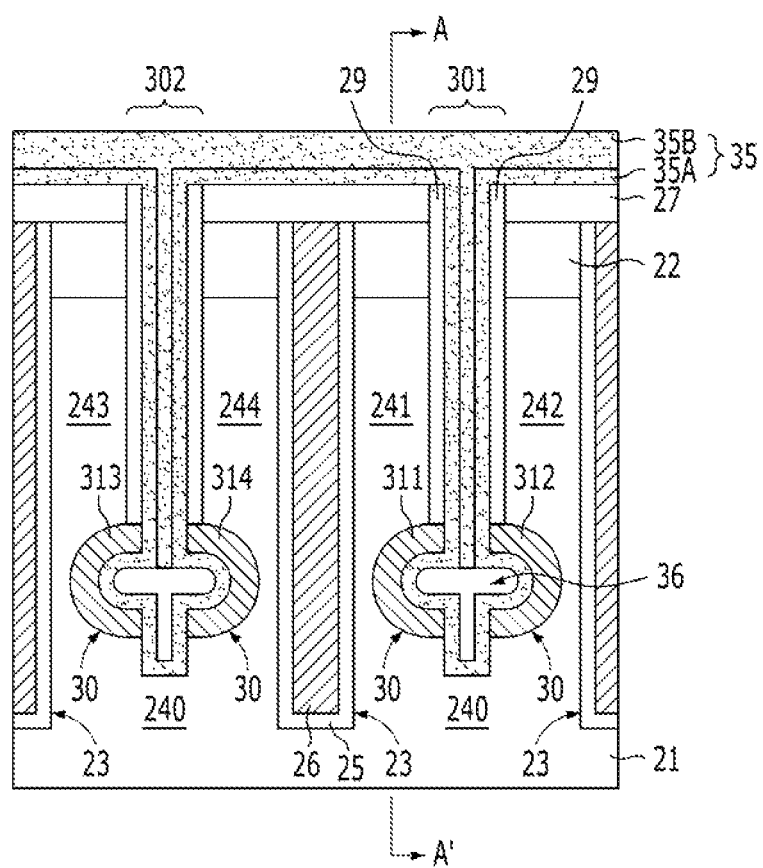

Referring to FIG. 3I, of the first bulb-type second trench 301 and the second bulb-type second trench 302 are formed with an interlayer dielectric layer 35. The interlayer dielectric layer 35 may include an oxide, such as BPSG (boron phosphorus silicate glass). The interlayer dielectric layer 35 is formed so that air gaps 36 are be defined. The interlayer dielectric layer 35 may include a first interlayer dielectric layer 35A and a second interlayer dielectric layer 35B. For example, after lining first bulb-type second trench 301 and the second bulb-type second trench 302 with the first interlayer dielectric layer 35A, the first bulb-type second trench 301 and the second bulb-type second trench 302 may be formed using the second interlayer dielectric layer 35B. Since the spaces of the first bulb-type second trench 301 and the second bulb-type second trench 302 are very narrow after forming the first interlayer dielectric layer 35A, the bulb portions of the first bulb-type second trench 301 and the second bulb-type second trench 302 are not formed when forming the second interlayer dielectric layer 35B. Thus, the air gaps 36 may be defined. Alternatively, the interlayer dielectric layer 35 may be formed using a method with poor step coverage to define the air gaps 36.

Subsequently, the interlayer dielectric layer 35 may be planarized such that the surfaces of the second mask patterns 27 are exposed.

The first buried bit line 311 and the second buried bit line 312 are isolated from each other by the interlayer dielectric layer 35. Likewise, the third buried bit line 313 and the fourth buried bit line 314 are isolated from each other by the interlayer dielectric layer 35. Furthermore, due to the presence of the air gaps 36, the parasitic capacitance between the first buried bit line 311 and the second buried bit line 312, and the parasitic capacitance between the third buried bit line 313 and the fourth buried bit line 314 may be significantly decreased.

According to an exemplary implementation, the buried bit lines 311, 312, 313 and 314 are formed in the un-protected recessed sidewalls 30 of the body lines 241, 242, 243 and 244, which are separated by the first bulb-type second trench 301 and the second bulb-type second trench 302. Moreover, adjacent pairs of buried bit lines 311, 312, 313 and 314 may be formed in the first bulb-type second trench 301 and the second bulb-type second trench 302, respectively. Therefore, adjacent buried bit lines 311/312 and 313/314 are sufficiently separated from each other by the first bulb-type second trench 301 and the second bulb-type second trench 302, respectively. Accordingly, the parasitic capacitance ($C_B$) between the adjacent buried bit lines 311/312 and 313/314 is decreased. Also, since the air gaps 36 are defined between the adjacent buried bit lines 311/312 and 313/314, the parasitic capacitance is further decreased.

Since the support 26 is formed between the buried bit lines 311 and 314, the punch-through between the buried bit lines 311 and 314 is prevented. In addition, because the depth of the first trench 23, in which the support 26 is formed, is larger than the depth of the second trenches 301 and 302, in which the buried bit lines 311 and 314 are formed, the punch-through between the buried bit lines 311 and 314 may be prevented. Due to the presence of the punch-through preventing patterns 34, it is possible to prevent the punch-through between the adjacent pairs of buried bit lines 311/312 and 313/314.

The body lines 241, 242, 243 and 244 are supported by the supports 26. Thus, it is possible to form the body lines 241, 242, 243 and 244 that have improved stability.

Vertical channel transistors including pillars may be formed on the body lines 241, 242, 243 and 244. In an exemplary implementation, the pillars may be formed by etching portions of the body lines 241, 242, 243 and 244. This will be described later with reference to FIGS. 5A to 5D.

FIGS. 4A to 4J are views illustrating an exemplary method for forming the buried bit lines of an exemplary semiconductor device.

Figure 4A:
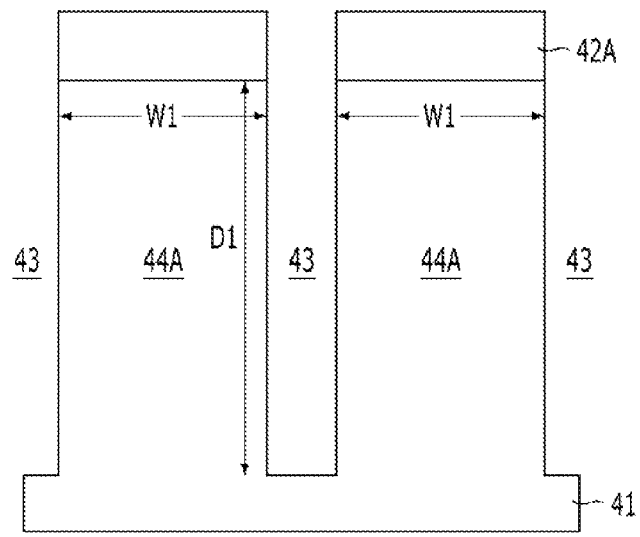
FIGS. 4A to 4J are views illustrating an exemplary method for forming the buried bit lines of the semiconductor device in accordance with an exemplary embodiment.

Referring to FIG. 4A, first mask patterns 42A are formed on a semiconductor substrate 41. The semiconductor substrate 41 includes a monocrystalline substance, such as monocrystalline silicon. The first mask patterns 42A include a silicon nitride. The first mask patterns 42A may be a stack structure that includes a silicon oxide and a silicon nitride. For example, the first mask patterns 42A may be deposited in order of a silicon nitride and a silicon oxide. Furthermore, the first mask patterns 42A may be deposited in order of a silicon nitride, a silicon oxide, a silicon oxynitride, or amorphous carbon. In the case where the silicon nitride is included, a pad oxide layer (not shown) may be additionally formed between the semiconductor substrate 41 and the first mask patterns 42A. The first mask patterns 42A may be formed using unillustrated photoresist patterns. The first mask patterns 42A are formed to extend in the first direction X. The first mask patterns 42A may include line patterns that extend in the first direction X.

Next, the semiconductor substrate 41 is etched using the first mask patterns 42A as etch masks to define a plurality of first trenches having a predetermined depth when measured from the upper surface of the semiconductor substrate 41. The first trenches 43 may extend in the first direction X. The first trenches 43 divide the semiconductor substrate 41 into a plurality of active regions 44A. Each active region 44A, of the plurality of active regions 44A, has a pair of sidewalls. An etching process for defining the first trenches 43 may include anisotropic etching. When viewed on the top, the active regions 44A are separated by the first trenches 43 and have line-type shapes that extend in the first direction X. Also, the active regions 44A are formed perpendicular to the first direction X and the second direction Y on the semiconductor substrate 41.

As described above, the plurality of active regions 44A are separated from one another by the first trenches 43. The plurality of active regions 44A each have a first width W1. Since the first width W1 has a substantially large dimension based on two body lines and a space defined therebetween, it is possible to prevent the active regions 44A from leaning when defining the first trenches 43. The first trenches 43 have a first depth D1.

Figure 4B:
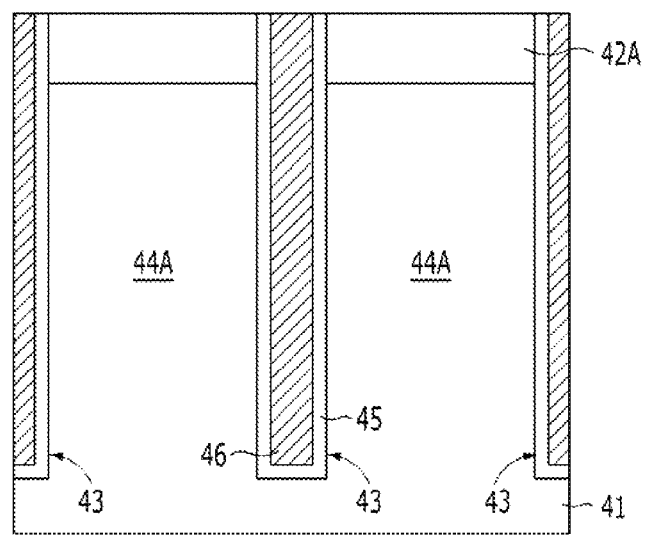

Referring to FIG. 4B, a liner layer 45 may be formed on the sidewalls of the active regions 44A that define the sidewalls of a first trench 43 to fill the first trench 43. The liner layer 45 may include a nitride, such as a silicon nitride. A support 46 is then formed in the first trench 43, on the liner layer 45, to fill the first trench. The support 46 may include an oxide, such as a silicon oxide. The support 46 may include a substance with a low dielectric constant, so that a parasitic capacitance between buried bit lines (that will be subsequently formed) may be decreased. In order to form the support 46, a planarization process, such as etch-back or CMP (chemical mechanical polishing), may be performed after the first trench 43 is formed.

The support 46 is formed between adjacent active regions 44A. Thus, pattern leaning may be prevented when subsequently performing an etching process on the adjacent active regions 44A. Also, the support 46 may serve as a separation layer that separates adjacent active regions 44A.

Figure 4C:
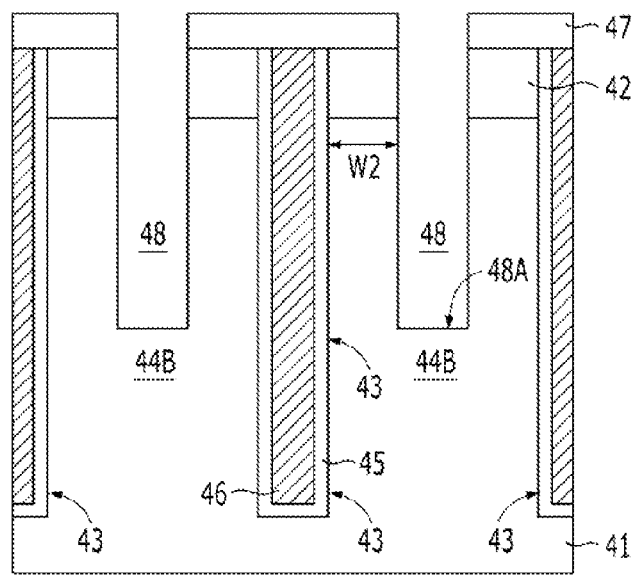

Referring to FIG. 4C, second mask patterns 47 are formed on the supports 46 and the first mask patterns 42A. The second mask patterns 47 may include line patterns that extend in the first direction X. Portions of the first mask patterns 42A are exposed through line type spaces that are defined between adjacent second mask patterns 47. Middle portions of the respective first mask patterns 42A may be exposed through the spaces between the second mask patterns 47.

In this way, the second mask patterns 47 cover at least the upper ends of the supports 46 and have the line-type spaces that are patterned to expose the middle portions of the first mask patterns 42A.

The second mask patterns 47 may be formed of a substance that may provide an etching selectivity with respect to the first mask patterns 42A, such as amorphous carbon. A photolithography process may be employed to form the second mask patterns 47.

The exposed first mask patterns 42A and the active regions 44A that lie under the first mask patterns 42A are etched using the second mask patterns 47 as etch masks to define a plurality of second trenches 48. The respective second trenches 48 are defined between adjacent first trenches 43. An upper portion of an active region 44A is divided by a second trench 48. An active region divided by the second trench is designated by the reference numeral 44B. A first mask pattern 42 may remain on the active regions 44B. The second trench 48 has a second width W2. The second width W2 may correspond to ⅓ of the first width W1. The second trench 48 has a depth that may be smaller than the first depth D1 of the first trench 43.

Since the active region 44B is supported by the support 46, pattern leaning does not occur when defining the second trench 48.

Figure 4D:
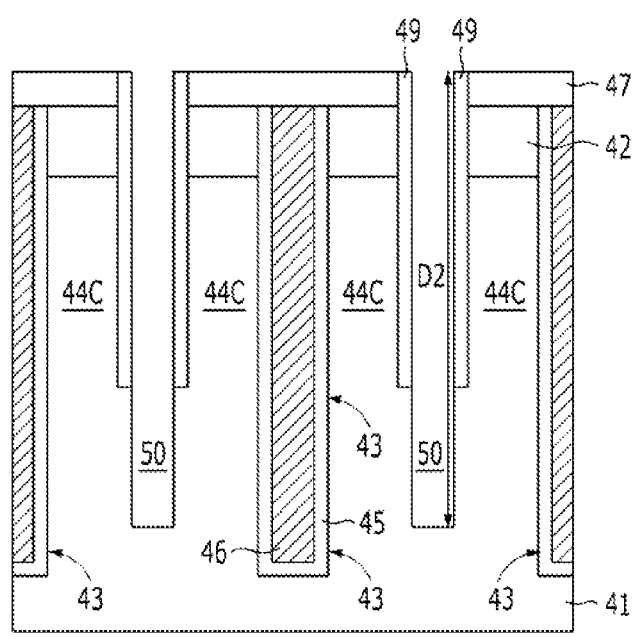

Referring to FIG. 4D, spacers 49 are formed on the sidewalls of the active region 44B that defines the sidewalls of the second trenches 48. The spacers 49 may include a nitride, such as a silicon nitride. In order to form the spacers 49, the nitride may be conformally formed, and then, etch-back may be performed. The spacers 49 cover the sidewalls of the second trench 48 and cover the sidewalls of the first mask pattern 42 and second mask pattern 47.

The active region 44B is etched using the spacers 49, and the first mask pattern 42, and second mask pattern 47 as etch barriers. Thus, a surface of the active region 44B that defines a bottom 48A of the second trench 48 is selectively etched to define a third trench 50. An active region having the third trench 50 is designated by the reference numeral 44C. The second trench 48 and the third trench 50 form integral trench structures. The total depth of the third trench 50 and the second trench 48 is defined as a second depth D2. The second depth D2 is set to be smaller than the first depth D1 of the first trench 43.

Figure 4E:
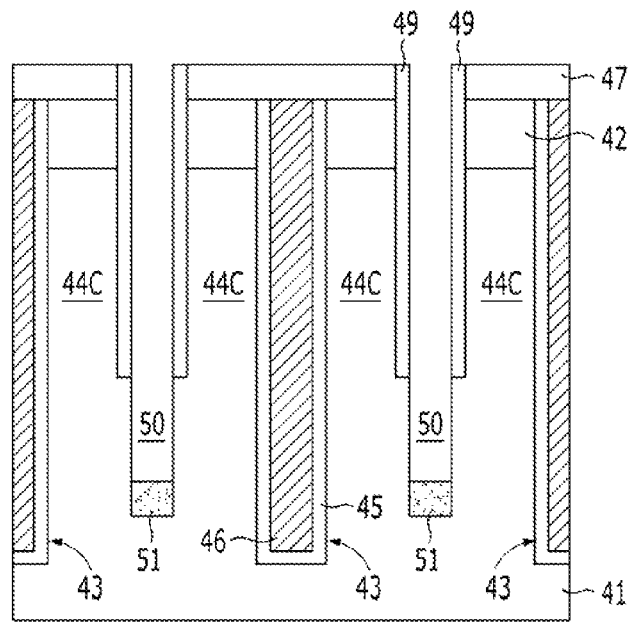

Referring to FIG. 4E, punch-through preventing patterns 51 that partially fill the third trenches 50 are formed. The punch-through preventing patterns 51 may include an oxide such as a silicon oxide. Furthermore, the punch-through preventing patterns 51 may include a nitride such as a silicon nitride. The punch-through preventing patterns 51 may serve as etch barriers in a subsequent isotropic etching process.

Figure 4F:
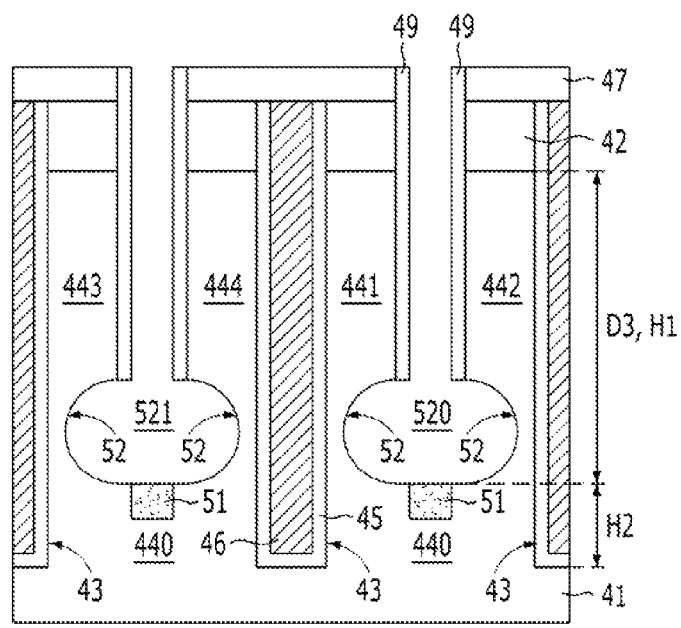

Referring to FIG. 4F, isotropic etching is performed using the spacers 49 and the first and second mask patterns 42 and 47 as etch barriers. According to this fact, both sidewalls of the third trenches 50, which are not protected by the spacers 49 and the punch-through preventing patterns 51, are selectively etched, and recessed sidewalls 52 are formed. By the recessed sidewalls 52, a plurality of body lines 441, 442, 443 and 444 are formed. As a result, the plurality of body lines 441, 442, 443 and 444 are separated from one another by fourth trenches 520 and 521 including the recessed sidewalls 52. The fourth trenches 520 and 521 have bulb-type trench structures including the second trenches 48 and the recessed sidewalls 52.

By such isotropic etching, the fourth trenches 520 and 521 may become bulb-type trenches. Therefore, the lower portions of the fourth trenches 520 and 521 may have curvatures. Etch amounts on the lower sidewalls of the respective body lines 441, 442, 443 and 444 may be controlled. The depth of the fourth trenches 520 and 521 may be limited by the punch-through preventing patterns 51.

The bulb-type fourth trenches 520 and 521 are defined between two adjacent first trenches 43. The plurality of body lines 441, 442, 443 and 444 are separated from one another by the fourth trenches 520 and 521. For example, the first body line 441 and the second body line 442 are separated by the fourth trench 520, and the third body line 443 and the fourth body line 444 are separated by the fourth trench 521. As a consequence, as the first body line 441 and the second body line 442 are paired by the fourth trench 520, a first body line pair is formed. Also, as the third body line 443 and the fourth body line 444 are paired by the fourth trench 521, a second body line pair is formed. The first body line pair and the second body line pair may be separated from each other by the support 46. Another body line pair may be formed with the support 46 interposed between two body lines. For instance, the first body line 441 and the fourth body line 444 may form a pair.

The fourth trenches 520 and 521 have a third depth D3. The third depth D3 is controlled to be smaller than the first depth D1 of the first trenches 43 in which the supports 46 are formed. The respective body lines 441, 442, 443 and 444 have a height H1 that is identical to the third depth D3. The respective body lines 441, 442, 443 and 444 have the same width. Even though the third depth D3 of the fourth trenches 520 and 521 is substantial, the body lines 441, 442, 443 and 444 are prevented from leaning, due to the presence of the supports 46. When viewed on the top, the plurality of body lines 441, 442, 443 and 444 are separated from one another by the fourth trenches 520 and 521 and extend in the first direction. The sidewalls of the body lines 441, 442, 443 and 444 are recessed by the fourth trenches 520 and 521. In other words, since the fourth trenches 520 and 521 are bulb-type trenches, the body lines 441, 442, 443 and 444 have the recessed sidewalls 52 according to the shapes of bulbs. The recessed sidewalls 52 are formed on any one sidewalls of the respective body lines 441, 442, 443 and 444. The respective body lines 441, 442, 443 and 444 have first sidewalls and second sidewalls. The first sidewalls are formed perpendicular to the first direction X and the second direction Y, and the second sidewalls are the recessed sidewalls 52. The recessed sidewalls 52 of the body lines that form a pair face each other. The first mask patterns 42 and the second mask patterns 47 remain on the body lines 441, 442, 443 and 444. The spacers 49 remain on the sidewalls of the body lines 441, 442, 443 and 444. The recessed sidewalls 52 may be non-protected sidewalls that are not protected by the spacers 49. Thus, the recessed sidewalls 52 may be referred to as recessed non-protected sidewalls.

According to the series of processes described above, each of the active regions 44A is divided into two, and the plurality of body lines 441, 442, 443 and 444 that are separated by the fourth trenches 520 and 521 are formed. The respective body lines 441, 442, 443 and 444 have the recessed sidewalls 52. The recessed sidewalls 52 may be the sidewalls of the body lines 441, 442, 443 and 444. The upper sidewalls of the body lines 441, 442, 443 and 444 are protected by the spacers 49. According to the height of the spacers 49, the heights of the upper sidewalls and the lower sidewalls of the body lines 441, 442, 443 and 444 may be controlled. The lower sidewalls of the body lines 441, 442, 443 and 444 mean the non-protected sidewalls that are exposed out of the spacers 49. Semiconductor bodies 440 with a predetermined height H2 may remain under the body lines 441, 442, 443 and 444. The semiconductor bodies 440 are formed on the semiconductor substrate 41. The body lines 441, 442, 443 and 444 are formed perpendicular to the first direction X and the second direction Y on the semiconductor bodies 440. Two body lines may be formed on each semiconductor body 440. Adjacent semiconductor bodies 440 are separated from each other by the first trenches 43, and the supports 46 are formed in the first trenches 43.

Figure 4G:
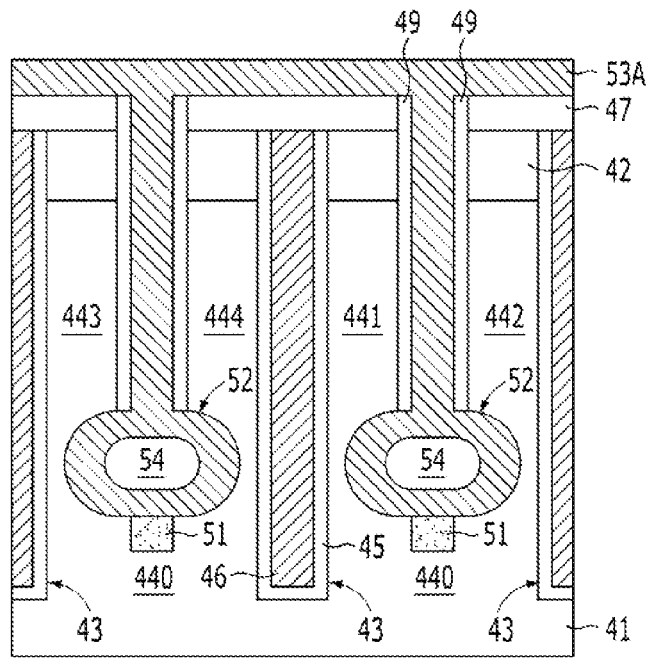

Referring to FIG. 4G, a conductive layer 53A is formed on the entire surface to gapfill the fourth trenches 520 and 521. The conductive layer 53A may include a metal such as a near-noble metal and a refractory metal. For example, the conductive layer 53A includes any one selected among cobalt (Co), titanium (Ti), tantalum (Ta), nickel (Ni), tungsten (W), platinum (Pt) and palladium (Pd). The conductive layer 53A is formed through chemical vapor deposition (CVD) or atomic layer deposition (ALD). The deposition depth of the conductive layer 53A may be controlled to be a thickness that covers at least the recessed sidewalls 52.

When forming the conductive layer 53A as described above, voids 54 may be created. The voids 54 may be created in the bulbs of the fourth trenches 520 and 521 adjacent to the recessed sidewalls 52.

Meanwhile, before forming the conductive layer 53A, source/drain regions (not shown) may be formed. The source/drain regions may be formed using plasma doping, tilt ion implantation, etc. In particular, the plasma doping is possible without experiencing a shadow effect by a surrounding structure. Due to this fact, the source/drain regions may be formed at desired positions. The source/drain regions may be formed on the surfaces of the recessed sidewalls 52. In another method for forming the source/drain regions, doped polysilicon doped in situ with a dopant may be used. For example, by gapfilling and then annealing doped polysilicon, the dopant in the doped polysilicon may be diffused.

Figure 4H:
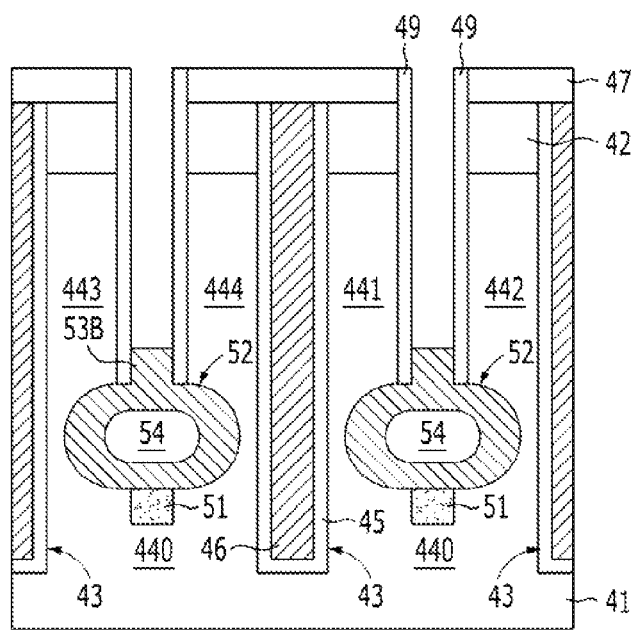

Referring to FIG. 4H, the conductive layer 53A is planarized and etched back. According to this fact, conductive layer patterns 53B are formed to partially fill the fourth trenches 520 and 521.

Figure 4I:
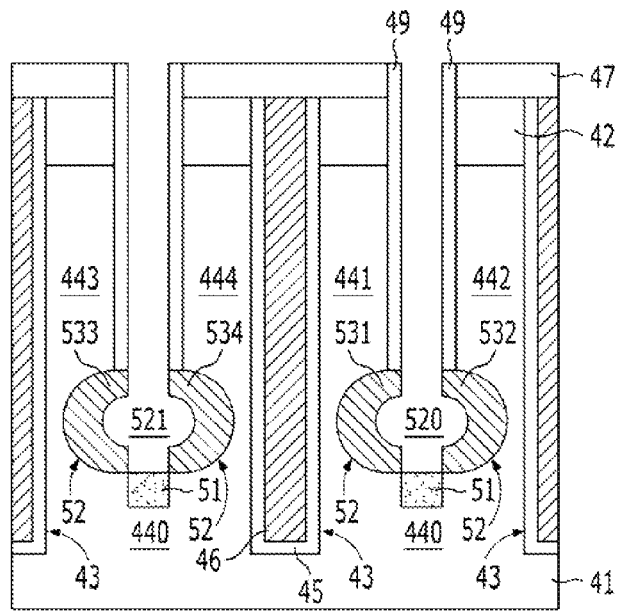

Referring to FIG. 4I, by selectively etching the conductive layer patterns 53B, a plurality of buried bit lines 531, 532, 533 and 534 are formed. The conductive layer patterns 53B may be etched through etch-back.

The buried bit lines 531, 532, 533 and 534 may have structures that are formed in the recessed sidewalls 52 of the body lines 441, 442, 443 and 444. The buried bit lines 531, 532, 533 and 534 may be formed in the fourth trenches 520 and 521. Moreover, the buried bit lines 531, 532, 533 and 534 may be formed by being formed into the recessed sidewalls 52 of the body lines 441, 442, 443 and 444. The pair of buried bit lines 531 and 532 are separately formed in the fourth trench 520, and the pair of buried bit line 533 and 534 are separately formed in the fourth trench 521.

The pairs of buried bit lines 531/532 and 533/534 are sufficiently isolated from each other by the punch-through preventing patterns 51. In this way, punch-through between the buried bit lines 531/532 and 533/534 may be prevented by the punch-through preventing patterns 51. The shapes of the voids 54 may be transcribed as the surfaces of the buried bit lines 531, 532, 533 and 534.

The plurality of buried bit lines 531, 532, 533 and 534 may form other pairs with the supports 46 interposed between two adjacent buried bit lines. For example, the buried bit lines 531/534 may form another pair with the support 46 interposed therebetween. Since the depth of the first trenches 43 is substantial, punch-through between the buried bit lines 531/534 is prevented.

Figure 4J:
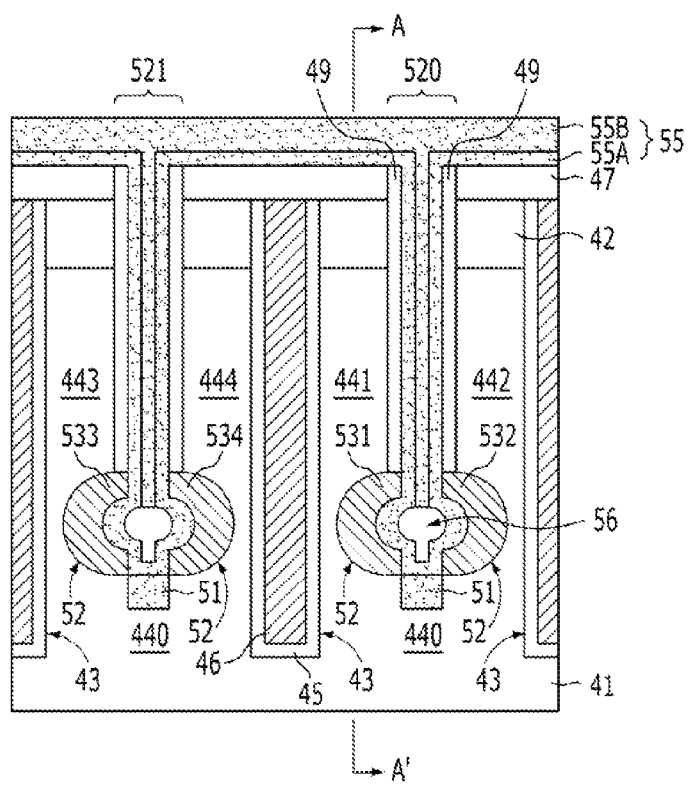

Referring to FIG. 4J, an interlayer dielectric layer 55 is formed in the fourth trenches 520 and 521. The interlayer dielectric layer 55 may include an oxide such as BPSG (boron phosphorus silicate glass). When the interlayer dielectric layer 55 is formed, air gaps 56 may be defined between the pairs of buried bit lines 531/532 and 533/534. The interlayer dielectric layer 55 may include a first interlayer dielectric layer 55A and a second interlayer dielectric layer 55B. For example, after lining the first interlayer dielectric layer 55A, the fourth trenches 520 and 521 may be formed using the second interlayer dielectric layer 55B. Since the spaces of the fourth trenches 520 and 521 after forming the first interlayer dielectric layer 55A is very narrow, the lower portions of the fourth trenches 520 and 521 are not formed when forming the second interlayer dielectric layer 55B. According to this fact, the air gaps 56 may be defined. In another embodiment, in order to define the air gaps 56, the interlayer dielectric layer 55 may be formed using a method with poor step coverage.

Subsequently, the interlayer dielectric layer 55 may be planarized such that the surfaces of the second mask patterns 47 are exposed.

By the interlayer dielectric layer 55, the pairs of buried bit lines 531/532 and 533/534 are isolated from each other. Furthermore, due to the presence of the air gaps 56, the parasitic capacitance between the pairs of buried bit lines 531/532 and 533/534 may be significantly decreased.

According to the present embodiment, the buried bit lines 531, 532, 533 and 534 are formed in the body lines 441, 442, 443 and 444 that are separated by the fourth trenches 520 and 521. Moreover, the buried bit lines 531, 532, 533 and 534 may be formed in the fourth trenches 520 and 521 to define structures that form pairs. Therefore, adjacent buried bit lines 531/532 and 533/534 are sufficiently separated from each other by the fourth trenches 520 and 521, and the parasitic capacitance ($C_B$) between the adjacent buried bit lines 531/532 and 533/534 is decreased. Also, since the air gaps 56 are defined between the adjacent buried bit lines 531/532 and 533/534, the parasitic capacitance is further decreased.

Since the support 46 is formed between the buried bit lines 531 and 534, the punch-through between the buried bit lines 531 and 534 is prevented. In addition, because the depth of the first trench 43 in which the support 46 is formed is larger than the depth of the fourth trenches 520 and 521 in which the buried bit lines 531 and 534 are formed, the punch-through between the buried bit lines 531 and 534 may be further prevented.

The body lines 441, 442, 443 and 444 are firmly supported by the supports 46. Thus, it is possible to form the body lines 441, 442, 443 and 444 that are structurally stable.

Vertical channel transistors including pillars may be formed on the body lines 441, 442, 443 and 444. In the present embodiment, by etching portions of the body lines 441, 442, 443 and 444, the pillars may be formed. A method for forming pillars, vertical channel transistors, word lines and capacitors will be described below in the following embodiment.

FIGS. 5A to 5D are views illustrating an exemplary method for forming the pillars and the word lines of the semiconductor device in accordance with the first embodiment. The method described below is according to the line A-A' of FIG. 3I.

Figure 5A:
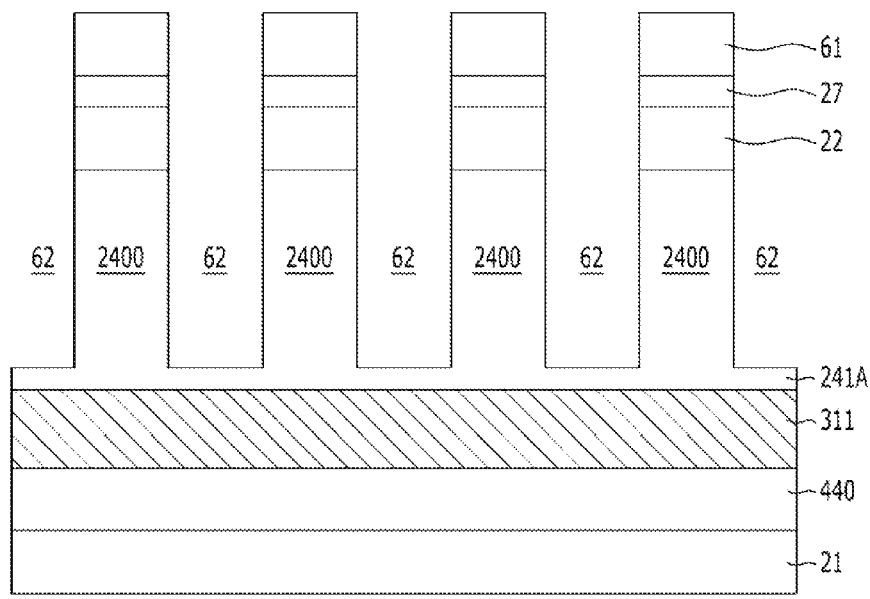
FIGS. 5A to 5D are views illustrating an exemplary method for forming the pillars and the word lines of the semiconductor device in accordance with an exemplary embodiment.

Referring to FIG. 5A, third trenches 62 are defined. The third trenches 62 are defined by etching portions of the body line 241. In order to define the third trenches 62, third mask patterns 61 may be used. The third mask patterns 61 may include line patterns that extend in the direction crossing with the body line 241. Using the third mask patterns 61 as etch masks, the second mask patterns 27 and the first mask patterns 22 are etched, and in succession, the body line 241 is etched by a predetermined depth. According to this fact, the third trenches 62 are defined, and a plurality of pillars 2400 are formed to be separated by the third trenches 62. The bottoms of the third trenches 62 may have a depth that does not expose the buried bit line 311.

In this way, the pillars 2400 are formed by etching the body line 241, and a body line 241A remains under the pillars 2400. The body line 241A and the pillars 2400 become active regions. The buried bit line 311 is formed in the body line 241A. The semiconductor body 440 is formed between the buried bit line 311 and the semiconductor substrate 21. The body line 241A has the type of a line that extends in the same direction as the buried bit line 311. The pillars 2400 have shapes that extend perpendicular to the first direction X and the second direction Y on the body line 241A. The pillars 2400 are formed by the unit of cell. Accordingly, the plurality of pillars 2400 are formed on one body line 241A and are separated from one another by the third trenches 62. The third trenches 62 may have a depth that does not expose the buried bit line 311. The pillars 2400 have structures in which the source/drain regions and the channel regions of vertical channel transistors are formed. The plurality of pillars 2400 may have the array layout of a matrix structure on the body line 241A. The pillars 2400 may include silicon pillars. The pillars 2400 may include monocrystalline silicon pillars.

Figure 5B:
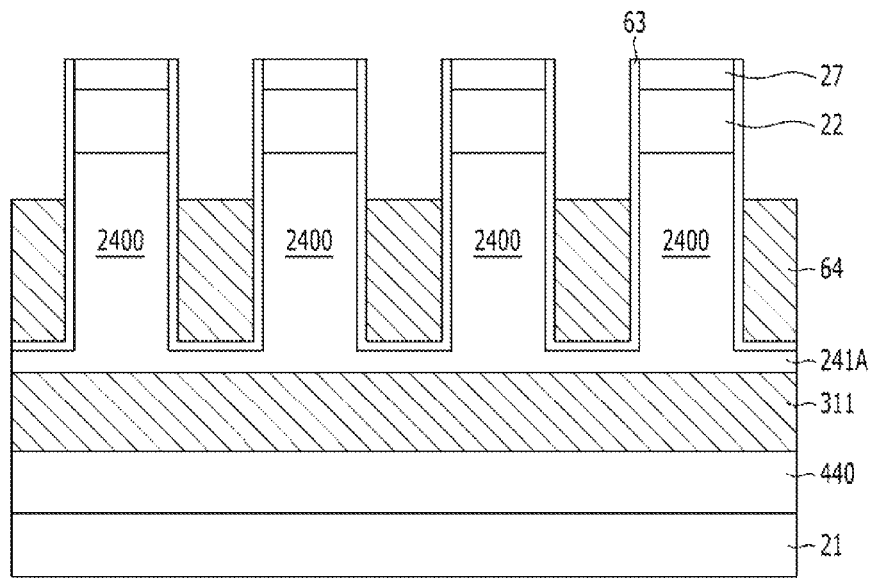

Referring to FIG. 5B, after removing the third mask patterns 61, a third conductive layer 64 is formed to partially gapfill the third trenches 62. A gate dielectric layer 63 may be formed before forming the third conductive layer 64. The gate dielectric layer 63 may be formed by oxidating the sidewalls of the pillars 2400 and the upper surfaces of the body line 241A. The third conductive layer 64 is formed using a low resistance substance. For example, a metallic layer may be used. The metallic layer may include a titanium layer, a titanium nitride layer, a tungsten layer, etc. The third conductive layer 64 may be recessed by sequentially performing planarization and etch-back.

Figure 5C:
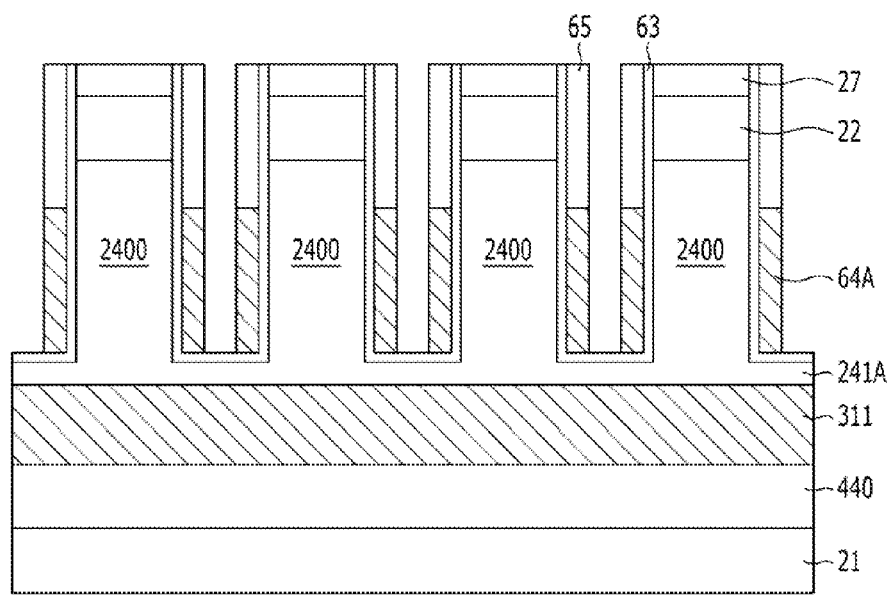

Referring to FIG. 5C, by performing etch-back after depositing a dielectric layer, spacers 65 are formed. The spacers 65 may include a nitride layer.

The third conductive layer 64 is etched using the spacers 65 as etch barriers. According to this fact, word lines 64A are formed on the sidewalls of the pillars 2400. The word lines 64A may be formed in the second direction crossing with the buried bit line 311. The word lines 64A also serve as vertical gate electrodes. In another embodiment, word lines 64A may be formed to surround the pillars 2400. In still another embodiment, after forming annular vertical gate electrodes that surround the pillars 2400, word lines 64A may be formed to connect the vertical gate electrodes with one another. In further still another embodiment, after forming vertical gate electrodes, word lines 64A may be formed over the pillars 2400 to be connected with the vertical gate electrodes through gate contacts.

Figure 5D:
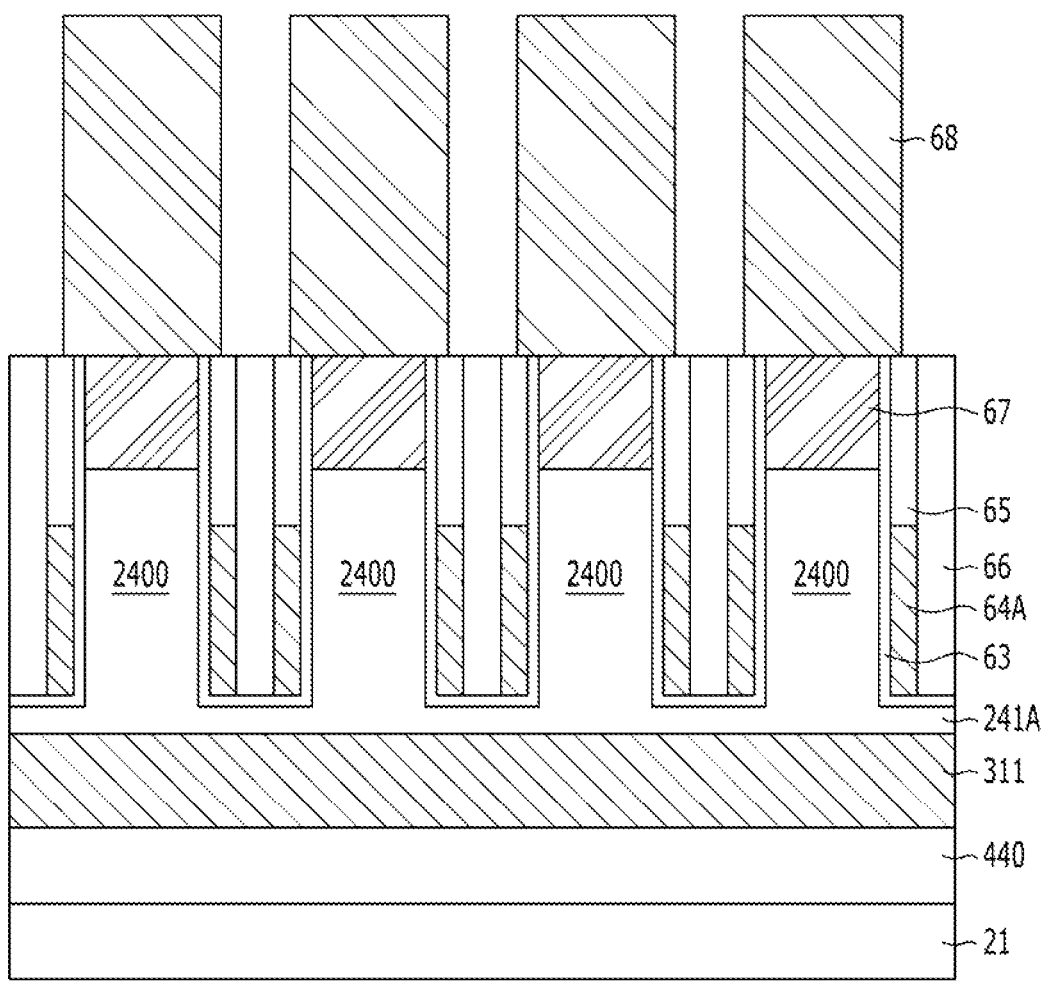

Referring to FIG. 5D, an interlayer dielectric layer 66 is formed to isolate the word lines 64A from one another.

By selectively removing the first mask patterns 22 and the second mask patterns 27, contact holes are defined on the pillars 2400. By performing ion implantation for the surfaces of the pillars 2400 under the contact holes, source/drain regions (not shown) are formed. Then, storage node contact plugs 67 are formed to fill the contact holes.

Storage nodes 68 of capacitors may be formed on the storage node contact plugs 67. The storage nodes 68 may have pillar-like shapes. In another embodiment, the storage nodes 68 may have cylinder shapes or concave shapes. Subsequently, a dielectric layer and top electrodes may be formed on the storage nodes 68.

As is apparent from the above descriptions, according to the various embodiments, since body lines are formed after forming supports, the aspect ratio of the body lines may be decreased, and according to this fact, it is possible to prevent the body lines from leaning.

Further, according to the various embodiments, by forming the supports and punch-through preventing patterns between adjacent buried bit lines, it is possible to prevent punch-through from occurring between the adjacent buried bit lines.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming active regions on a semiconductor substrate, the active regions being separated by a plurality of first trenches;
    forming a support in each first trench of the plurality of first trenches;
    defining, by etching the active regions, second trenches that are shallower than the plurality of first trenches;
    forming a pair of buried bit lines in each of the second trenches;
    forming a first interlayer dielectric layer on bottom and sidewalls of the second trenches; and
    forming a second interlayer dielectric layer on the first interlayer dielectric layer, to form an air gap between adjacent the buried bit lines,
    wherein the second interlayer dielectric layer is filled over the air gap in a top portion of the second trenches.

2. The method of claim 1, wherein forming the supports comprises:
    forming a dielectric layer on an entire surface to gapfill the first trenches; and
    planarizing the dielectric layers.

3. The method of claim 1, wherein defining the second trenches comprises:
    defining second trenches to divide each of the active regions;
    forming spacers on sidewalls of the second trenches; and
    etching bottoms of the second trenches; and
    forming recessed sidewalls in each of the active regions.

4. The method of claim 3, wherein forming the pair of buried bit lines comprises:
    forming a conductive layer on a surface defining the second trenches; and
    etching the conductive layer so that the conductive layer remains on the recessed sidewalls in each of the active regions.

5. The method of claim 4, wherein, after etching the conductive layer, the method further comprises:
    recessing bottoms of the second trenches, between pairs of the buried bit lines, to form punch-through preventing patterns.

6. A method for fabricating a semiconductor device, the method comprising:
    forming, on a semiconductor substrate, active regions that are separated by a plurality of first trenches;
    forming a support in each first trench of the plurality of first trenches;
    etching the active regions to define second trenches that are shallower than the plurality of first trenches;
    forming spacers on sidewalls of the second trenches;
    etching bottoms of the second trenches to define third trenches;
    forming punch-through preventing patterns in the third trenches;
    etching portions of the sidewalls that are not covered by the punch-through preventing patterns or the spacers, and forming recessed sidewalls which face each other;
    forming buried bit lines in the facing recessed sidewalls;
    forming a first interlayer dielectric layer on the spacers, the punch-through preventing patterns and the buried bit lines; and
    forming a second interlayer dielectric layer on the first interlayer dielectric layer, to form an air gap between adjacent the buried bit lines,
    wherein the second interlayer dielectric layer is filled over the air gap in top portion of the second trenches.

7. The method of claim 6, wherein forming the supports comprises:
    forming a dielectric layer on an entire surface to gapfill the first trenches; and
    planarizing the dielectric layer.

8. The method of claim 6, wherein forming the punch-through preventing patterns comprises:
    forming a dielectric layer on an entire surface to gapfill the third trenches; and
    etching the dielectric layer.

9. The method of claim 6, wherein forming the buried bit lines comprises:
    forming a conductive layer on an entire surface including the recessed sidewalls; and
    etching back the conductive layer.

* * * * *